United States Patent
Chiyo et al.

(10) Patent No.: US 7,029,939 B2
(45) Date of Patent: Apr. 18, 2006

(54) P-TYPE SEMICONDUCTOR MANUFACTURING METHOD AND SEMICONDUCTOR DEVICE

(75) Inventors: Toshiaki Chiyo, Aichi (JP); Naoki Shibata, Aichi (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/481,057

(22) PCT Filed: Jun. 17, 2002

(86) PCT No.: PCT/JP02/06027

§ 371 (c)(1),
(2), (4) Date: May 13, 2004

(87) PCT Pub. No.: WO02/103769

PCT Pub. Date: Dec. 27, 2002

(65) Prior Publication Data

US 2004/0185643 A1    Sep. 23, 2004

(30) Foreign Application Priority Data

Jun. 18, 2001    (JP) .............................. 2001-183992

(51) Int. Cl.
*H01L 21/22*    (2006.01)
*H01L 21/324*    (2006.01)

(52) U.S. Cl. .................. 438/47; 438/542; 438/766; 438/795

(58) Field of Classification Search ............ 438/29, 438/46, 47, 510, 523, 533, 542, 766, 769, 438/795
See application file for complete search history.

(56) References Cited

U.S. PATENT DOCUMENTS 6,291,840 B1 *    9/2001    Uemura et al. ............... 257/94

FOREIGN PATENT DOCUMENTS

JP    63-239989    10/1988
JP    3-218625    9/1991

(Continued)

OTHER PUBLICATIONS

Translation of International Preliminary Examination Report dated Dec. 18, 2003.

*Primary Examiner*—Michael Trinh
*Assistant Examiner*—Pamela E Perkins
(74) *Attorney, Agent, or Firm*—McGinn IP Law Group, PLLC

(57) ABSTRACT

A p-GaN layer 5 comprising materials such as a Group III nitride compound semiconductor is formed on a sapphire substrate 1 through MOVPE treatment, and a first metal layer 6 made of Co/Au is formed thereon. Then in a planar electron beam irradiation apparatus using plasma, electron beams are irradiated to the p-GaN layer 5 through the first metal layer 6. Accordingly, the first metal layer 6 prevents the surface of the p-GaN layer 5 from being damaged and resistivity of the p-GaN layer 5 can be lowered. Next, a second metal (Ni) layer 10 is formed on the first metal layer 6. And the first metal layer 6 is etched through the second metal layer 10 by using fluoric nitric acid. As a result, the first metal layer is almost completely removed. Then a light-transmitting p-electrode 7 made of Co/Au is formed thereon. As a result, a p-type semiconductor having decreased contact resistance and lower driving voltage can be obtained and optical transmittance factor of the p-type semiconductor improves.

13 Claims, 5 Drawing Sheets

FOREIGN PATENT DOCUMENTS

| | | | |
|---|---|---|---|
| JP | 5-183189 | 7/1993 | |
| JP | 5-198841 | 8/1993 | |
| JP | 5-206520 | 8/1993 | |
| JP | 06-314822 | * 11/1994 | |
| JP | 2001-52228 | 2/2001 | |
| JP | 2001-94149 | 4/2001 | |
| JP | 2001-156003 | 6/2001 | |
| JP | 2002-075903 | * 3/2002 | |

* cited by examiner

P-TYPE SEMICONDUCTOR MANUFACTURING METHOD AND SEMICONDUCTOR DEVICE

TECHNICAL FIELD

The present invention relates to a method for reducing resistivity of a semiconductor which is doped with p-type impurity through irradiation of electron beams and a semiconductor device using the p-type semiconductor with reduced resistivity.

Especially the present invention relates to a method for certainly reducing resistivity of a semiconductor by irradiating electron beams through a metal layer and further a method for decreasing driving voltage by completely removing the metal layer and forming an electrode.

The present invention also relates to a semiconductor device with decreased driving voltage by employing that method. The semiconductor device of the present invention can be applied to a photo-semiconductor which requires low driving voltage and high optical transmittance factor including, for example, light-emitting devices such as LEDs and LDs, optical devices such as solar cells, light-receiving devices, and other electronic devices such as FETs, HEMTs, other transistors, thyristors, and gas sensors.

BACKGROUND ART

As a method to lower resistivity of a p-type semiconductor which becomes to have p-type conductivity by doping impurity, conventional techniques using electron beam irradiation apparatuses are well known, for example, as shown in "Present Status and Future Prospects of GaN-based Light Emitting Devices" in Journal of Applied Physics Vol. 65, No. 7, 1996.

Such an electron beam irradiation apparatus which has been proposed in conventional art arranges samples (objects to which electron beams are irradiated, e.g., semiconductors) in vacuum, irradiates electron beams in vacuum and lowers resistivity of the semiconductor. Recently, because it consumes a lot of time to evacuate a chamber, a method for planar irradiation in which a great number of electrons are generated and electron beams are irradiated in plane in an ambient air has been proposed. That is disclosed in, for example, Japanese Patent Application No. 2000-253424 and No. 2000-254306 which are invented by the inventors of the present invention.

However, even when planar irradiation of electron beams is carried out, problems persist in deteriorating the surface of the semiconductor.

So, in order to prevent the semiconductor doped with p-type impurities from being deteriorated by electron beam irradiation, the inventors of the present invention invented a method in which a thin metal layer is formed on the surface of the semiconductor and electron beams are irradiated over the metal layer. As a result, lowering resistivity of the semiconductor is achieved without generating a damaged layer at the surface of the semiconductor (Japanese Patent Application No. 2000-254306).

The method can lower resistivity of the semiconductor, however, the metal layer after electron beam irradiation is oxidized and cannot be removed completely in consequent etching treatment. In short, when an electrode is formed on the semiconductor, contact resistance of the semiconductor increases and driving voltage cannot be decreased sufficiently. And if this method is applied to an optical device such as an LED, a laser device and a light-receiving device, optical transmittance factor of the device is decreased.

DISCLOSURE OF THE INVENTION

The present invention has been accomplished in an attempt to solve the aforementioned problems, and an object of the present invention is to form a metal layer on the surface of a semiconductor which is doped with p-type impurities and to carry out electron beam irradiation through the metal layer, to thereby prevent the surface layer of the semiconductor from being deteriorated.

Also, an object of the present invention is to completely remove the metal layer according to a method explained hereinbelow, form an electrode, and lower contact resistance of the electrode, to thereby decrease driving voltage of the semiconductor.

Also, an object of the present invention is to remove the metal layer almost completely and improve optical transmittance factor of the plane of the optical device from which the metal layer is removed.

In short, the object of the invention is to provide a semiconductor device having excellent light-emitting efficiency and light-receiving efficiency by improving energy efficiency of the semiconductor devices which emit a light or receive a light.

Also, an object of the present invention is to improve device characteristics of general electronic devices such as transistors, FETs, HEMTs, thyristors, and gas sensors, light-emitting device such as LEDs and lasers, light-receiving device such as solar cells and optical sensors.

The aforementioned objects may not be interpreted that each invention achieves all the objects but they are to be interpreted that each invention achieves each object.

In order to solve the aforementioned problems, the present invention provides the following.

Accordingly, an invention drawn to a first feature provides a method for fabricating a p-type semiconductor which lowers resistivity of a semiconductor doped with a p-type impurity, comprising the steps of: forming a first metal layer on the surface of the semiconductor which is doped with a p-type impurity; irradiating electron beams to the semiconductor doped with p-type impurity through the first metal layer; forming a second metal layer on the first metal layer after electron beam irradiation; and removing the first metal layer together with the second metal layer through etching treatment.

The semiconductor doped with the p-type impurity may be, for example, a Group III nitride compound semiconductor, which may be represented by the formula $Al_xGa_yIn_{1-x-y}N$ ($0 \leq x \leq 1$, $0 \leq y \leq 1$, $0 \leq x+y \leq 1$).

The invention drawn to a second feature provides a method according to the first feature, wherein the second metal layer is formed after etching the surface of the first metal layer.

As an etching solution for etching the first metal layer, for example, an iodine based solution may be employed.

The invention drawn to a third feature provides a method according to the first or the second features, wherein the first metal layer comprises at least one selected from the group consisting of cobalt (Co), nickel (Ni), aluminum (Al), copper (Cu), palladium (Pd), manganese (Mn), vanadium (V), gold (Au) and an alloy including at least one of these metals.

The invention drawn to a fourth feature provides a method according to any one of the first to third features, wherein the second metal layer comprises at least one selected from the group consisting of nickel (Ni) and cobalt (Co).

The invention drawn to a fifth feature provides a method according to any one of the first to fourth features, wherein the etching treatment carried out after forming the second metal layer employs a mixture of hydrofluoric acid, nitric acid and water as an etching solution.

The invention drawn to a sixth feature provides a method according to any one of the first to fifth features, wherein the semiconductor doped with p-type impurity is a Group III nitride compound semiconductor. The Group III nitride compound semiconductor may be, for example, a binary (GaN, InN, AlN), ternary (GaInN, AlInN, AlGaN), or quaternary (AlGaInN) Group III nitride compound semiconductor generally represented by a formula $Al_xGa_yIn_{1-x-y}N$ ($0 \leq x \leq 1$, $0 \leq y \leq 1$, $0 \leq x+y \leq 1$).

The invention drawn to a seventh feature provides a method according to any one of the first to sixth features, wherein the p-type impurity is magnesium (Mg). Alternatively, the p-type impurity may be a well-known p-type impurity such as zinc (Zn), beryllium (Be) and calcium (Ca). Further alternatively, magnesium (Mg) may be doped into the semiconductor layer in which beryllium (Be) is implanted. Alternatively, plural kinds of p-type impurities may be doped into the semiconductor layer, and also alternatively, an n-type impurity may be doped into the semiconductor layer as far as it does not interrupt p-type conductivity of the semiconductor layer.

The invention drawn to an eighth feature provides a method according to any one of the first to seventh features, wherein the first metal layer has thickness of 5 Å to 10000 Å.

The invention drawn to a ninth feature provides a method according to any one of the first to seventh features, wherein the first metal layer has thickness of 5 Å to 100 Å.

The invention drawn to a tenth feature provides a method according to any one of the first to ninth features, wherein the second metal layer has thickness of 100 Å to 6000 Å.

The invention drawn to an eleventh feature provides a method according to any one of the first to tenth features, wherein electrical potential of the first metal layer is maintained almost constantly by earthing and so on.

The invention drawn to a twelfth feature provides a semiconductor device in which plural numbers of semiconductor layers comprising Group III nitride compound semiconductor are formed on a substrate through crystal growth, comprising: a p-type semiconductor which is fabricated according to the method of any one of the first to eleventh features is formed in least a portion of the semiconductor layers comprised in the semiconductor device.

The invention drawn to a thirteenth feature provides a semiconductor device according to the twelfth feature, wherein the p-type semiconductor includes the uppermost layer of the Group III nitride compound semiconductor device and an electrode is formed on the uppermost p-type semiconductor layer.

The invention drawn to a fourteenth feature provides a semiconductor device according to the thirteenth feature, wherein the electrode formed on the surface of the p-type semiconductor has multiple layer structure.

The invention drawn to a fifteenth feature provides a semiconductor device according to the thirteenth and fourteenth features, wherein the electrode comprises at least one selected from the group comprising of cobalt (Co), nickel (Ni), aluminum (Al), copper (Cu), palladium (Pd), manganese (Mn), vanadium (V), gold (Au) and an alloy including at least one of these metals.

The invention drawn to a sixteenth feature provides a semiconductor device according to any one of the thirteenth to fifteenth features, wherein the electrode comprises an alloy including at least two selected from the group comprising of cobalt (Co), nickel (Ni), aluminum (Al), copper (Cu), palladium (Pd), manganese (Mn), vanadium (V) and gold (Au).

The invention drawn to a seventeenth feature provides a semiconductor device according to the fifteenth or sixteenth feature, wherein alloying process is carried out in an atmosphere comprising oxygen.

Here the atmosphere comprising oxygen may be an atmosphere comprising elements such as oxygen atoms, oxygen molecules, oxygen ions and oxygen radicals. The atmosphere may be pure oxygen atmosphere. Alternatively, the atmosphere may be mixture of oxygen and other inert gases such as nitrogen and argon. Alternatively, the atmosphere may be air, and may also be mixture of oxygen and air.

Through employment of the aforementioned aspects of the present invention, the aforementioned drawbacks can be overcome.

FIG. 2 shows an electron beam irradiation apparatus 100 which lowers resistivity of a semiconductor doped with a p-type impurity. Describing briefly, in this electron beam irradiation apparatus 100, helium gas is inserted into a plasma chamber 105, and helium ion gas ($He^+$) is generated by plasma power supply and a wire 106. In short, helium gas is changed to the plasma state. Its plasma voltage is about 200 kV. Consequently, plasma $He^+$ is accelerated by high-voltage electric field and is then collided to a cathode (cool cathode) 103 in the chamber 101 at high velocity. By this collision, a great number of electrons are emitted from the cathode 103, accelerated owing to the electric field toward the direction reverse to that of helium ion gas, and then irradiated to the semiconductor (p-GaN) doped with a p-type impurity. In general, that treatment is carried out in an ambient air. And that irradiation enables to lower resistivity of the semiconductor which is doped with a p-type impurity.

At this time, however, the surface layer of the semiconductor doped with a p-type impurity is damaged to the depth of several hundreds Å and resistivity of that surface layer may not be lowered. It is considered that such damage is generated because the surface of the semiconductor is charged up by irradiating a great number of electrons to the semiconductor and high-voltage electric field is generated locally, resulting in generating damage such as electrostatic discharge damage in the high-voltage electric field.

As a method for electron beam irradiation, a scanning method which is carried out in vacuum may be employed (a conventional method). Because electron beams are irradiated locally in this method, crystallinity of the surface of a semiconductor may be deteriorated or may be ununiform by variation of electric current, accelerating voltage, and vacuum.

So, according to the first feature, the first metal layer is formed on the surface of the semiconductor doped with p-type impurity, and electron beams are irradiated to the semiconductor doped with p-type impurity through the first metal layer. Because electrons accelerated in high-voltage electric field transmit the first metal layer which is formed to be a thin film, they reach the semiconductor doped with p-type impurity and resistivity of the semiconductor can be lowered. On the contrary, because the charge-up is prevented by the first metal layer formed on the surface of the semiconductor, damage of the surface of the semiconductor can be suppressed and a problem that its resistivity is hardly lowered will not occur.

In short, when electron beams are irradiated directly to the surface of the semiconductor without forming the first metal layer as in a conventional art, a problem occurs with respect to electrification (charge-up), but that problem may be improved by irradiating electron beams through the first metal layer. As a result, electron beams can be irradiated uniformly to the semiconductor, and that enables to evenly reduce resistivity of the semiconductor.

Next, in the first feature, the second metal layer is formed on the first metal layer after electron beam irradiation by employing, for example, vacuum evaporation treatment. When only the first metal layer is deposited on the semiconductor, the first metal layer is oxidized by electron beam irradiation and cannot be completely removed in the sequent etching treatment. Accordingly, by forming the second metal layer on the first metal layer, both of them can be easily removed through etching treatment.

In the present invention, the second metal layer comprises at least one of, e.g., nickel (Ni) and cobalt (Co), is formed on the first metal layer. Forming the first metal layer by using an alloy of cobalt (Co) and gold (Au) makes it easier to etch gold (Au), cobalt (Co) or an alloy including those metals through electrons compounded in nickel (Ni). In short, forming the second metal layer by using, e.g., nickel (Ni) or cobalt (Co), makes it easier to remove the first metal layer through the second metal layer. The second metal layer may also be removed in the etching process. As a result, resistivity of the semiconductor doped with p-type impurity may be lowered and the surface of the semiconductor may be cleaned.

When an electrode is formed on the semiconductor doped with p-type impurity to thereby obtain a semiconductor device, cleaned surface of the semiconductor enables to provide a semiconductor device comprising an optimum electrode which has excellent ohmic contact and small contact resistance. And that can reduce driving voltage of the semiconductor device. Also, optical transmittance factor of the surface of the p-type semiconductor, from which the first metal layer and the second metal layer are completely removed, may be improved. When that surface of the semiconductor doped with p-type impurity is employed as optical output or input plane in optical devices including light-emitting devices such as LEDs and LDs and light-receiving devices such as solar cells and optical sensors, its light-emitting efficiency and light-receiving efficiency may be improved compared with those of the conventional devices because an unnecessary metal layer hardly remains in the device. Consequently, a method for fabricating a p-type semiconductor optimum for an optical device is provided.

In the second feature, the second metal layer is formed after removing the first metal layer as much as possible through etching treatment. That is, adhesiveness of the first metal layer and the second metal layer is improved. As a result, the first metal layer can be removed more securely through the second metal layer in the sequent etching process.

In the third feature, the first metal layer comprises at least one selected from the group consisting of cobalt (Co), nickel (Ni), aluminum (Al), copper (Cu), palladium (Pd), manganese (Mn), vanadium (V), gold (Au) and an alloy including at least one of these metals. As a result, damage layers can be certainly prevented from being formed on the surface of the semiconductor doped with p-type impurity. By using an alloy including those metals or at least one of those metals, resistivity of the semiconductor can be certainly lowered.

In the fourth feature, the second metal layer comprises at least one selected from the group consisting of nickel (Ni) and cobalt (Co). That certainly prevents from forming the damage layers on the surface of the semiconductor doped with p-type impurity and lowers resistivity of the semiconductor.

By using those metals to form the second metal layer, the first metal layer may be completely removed in the sequent etching process. That is, the surface of the semiconductor may be surely cleaned.

In the fifth feature, the etching treatment employs a mixture of hydrofluoric acid, nitric acid and water as an etching solution. That enables to almost completely remove the first metal layer formed on the surface of the p-type semiconductor and the second metal layer formed thereon.

In the sixth feature, the semiconductor doped with the p-type impurity is a Group III nitride compound semiconductor. Especially, the semiconductor doped with p-type impurity comprising Group III nitride compounds may provide the above-described actions and effects.

In the seventh feature, the p-type impurity is magnesium (Mg). By applying Mg as an impurity to dope into the semiconductor, resistivity of the semiconductor may be easily reduced by applying electron beam irradiation. Preferably Mg is employed as the p-type impurity. Alternatively, the p-type impurity may be a well-known p-type impurity such as zinc (Zn) and beryllium (Be).

In the eighth feature, the first metal layer has thickness of 5 Å to 10000 Å. By forming the first metal layer to have thickness of 5 Å to 10000 Å, resistivity of the semiconductor doped with p-type impurity may be effectively lowered. In order to obtain the semiconductor doped with p-type impurity, which has suppressed damage on its surface and low resistive p-type conduction, the metal layer formed on the semiconductor may preferably have thickness of 100 Å to 5000 Å, further preferably 500 Å to 3000 Å. Especially, it was found that the first metal layer most preferably had thickness of about 100 Å. When thickness of the metal layer is more than 10000 Å, forming the metal layer takes too much time, and that is not desirable. When thickness of the metal layer is less than 5 Å, the metal layer can hardly prevent from generating damaged layer on the surface of the semiconductor, and that is not desirable.

In order to lower contact resistance toward the semiconductor doped with p-type impurity and to improve optical transmittance factor of the semiconductor by completely removing the first metal layer, the first metal layer may preferably have thickness of 5 Å to 100 Å as in the ninth feature. Especially thickness of the first metal layer may more preferably be 10 Å to 100 Å, and further preferably 50 Å to 100 Å. When the first metal layer has thickness of about 70 Å and electron beam irradiation is carried out, the semiconductor, which is doped with p-type impurity and the first metal layer and the second metal layer laminated in sequence thereon are removed from, has optical transmittance factor of 94% (at optical wavelength of 375 nm) to 96% (at optical wavelength of 520 nm). Here the optical transmittance factor is normalized so that optical transmittance factor of the semiconductor layer doped with p-type impurity before depositing the first metal layer 6 and the second metal layer thereon may be 100%. Similarly, when thickness of the first metal layer is 200 Å, the optical transmittance factor of the p-type semiconductor becomes 85% (at optical wavelength of 375 nm) to 88% (at optical wavelength of 520 nm). Accordingly, in order to obtain optical transmittance factor of 90% to 92% or more, the first metal layer may preferably have thickness of 100 Å or less.

Decrease of optical transmittance factor of the semiconductor represents that the first metal layer still remains, contact resistance of the semiconductor becomes larger when the metal electrode is formed on the semiconductor, and that optical transmittance factor and optical output decrease. Accordingly, in order to remove the first metal layer completely, in order to lower contact resistance between the semiconductor layer and the metal electrode deposited thereon by completely removing the first metal layer, or in order to improve optical transmittance factor, which represents to improve outer quantum efficiency of a light-emitting device or to improve light-receiving sensitivity of a light-receiving device, thickness of the first metal layer may preferably be 5 Å to 100 Å, most preferably 50 Å to 100 Å. When the first metal layer is too thin, it cannot function as a protection film. So thickness of the first metal layer is preferably 5 Å or more. For preventing from forming damaged layers on the surface of the p-type impurity doped semiconductor, thickness of the first metal layer is preferably 50 Å or more.

When the second metal layer is formed to have thickness of 100 Å to 6000 Å as in the tenth feature, the first metal layer can be removed more effectively in the etching process. More preferably, thickness of the second metal layer may be 500 Å to 3000 Å. Further preferably, thickness of the second metal layer may be 1000 Å to 2000 Å. For example, if the second metal layer is formed to have thickness of less than 100 Å through vacuum evaporation, it may be formed in an island pattern. At that time, the first metal layer cannot be removed evenly in the etching process, and that is not desirable. And when the second metal layer is formed to have thickness of 6000 Å or more, the etching process takes too much time and that is not efficient. Consequently, thickness of the second metal layer may preferably 100 Å to 6000 Å. The first metal layer can be removed completely and effectively when thickness of the second metal layer is 1000 Å to 2000 Å.

The first metal layer may be made of, for example, cobalt (Co), nickel (Ni), aluminum (Al), copper (Cu), palladium (Pd), manganese (Mn), vanadium (V), gold (Au) or an alloy including at least one of these metals. As an alloy for forming the first metal layer, combination of cobalt (Co) and gold (Au) is the most optimum. As a result, effect of lowering resistivity of the semiconductor layer can be obtained more than a certain value. And by etching through the second metal layer, the first metal layer can be removed almost completely.

In the eleventh feature, electrical potential of the first metal layer is maintained almost constantly by earthing and so on. Accordingly, by maintaining electrical potential of the first metal layer, or the semiconductor doped with p-type impurity, almost completely by earthing, electrification of the semiconductor doped with p-type impurity can be prevented or relaxed. Then generation of damaged layer at the surface (electron beam irradiation plane) of the semiconductor doped with p-type impurity can be prevented or reduced. As a result, resistance of the semiconductor doped with p-type impurity can be lowered effectively.

For example, as shown in FIG. 3, a substrate holder is made of a conductive material and is contacted to the first metal layer formed on the surface of the semiconductor doped with p-type impurity, e.g., p-GaN. Consequently, electrical potential of the semiconductor doped with p-type impurity can maintain the earth voltage. Then low-energy electrons generated by plasma flow to the earth, which surely prevents damaged layers from generating on the surface of the semiconductor doped with p-type impurity.

In the twelfth feature, a p-type semiconductor which has resistivity lowered according to the method of any one of the first to eleventh features is formed in least a portion of the semiconductor layers comprised in a semiconductor device.

The Group III nitride compound semiconductor (p-type semiconductor) having lower resistivity can be useful for forming, for example, especially a p-type contact layer and other p-type layers in light-emitting devices including LEDs and semiconductor lasers and also light-receiving devices. By employing a p-type semiconductor whose resistivity is adequately lowered in a semiconductor device, driving voltage of the device can be decreased compared with a conventional semiconductor device.

And optical transmittance factor of the p-type semiconductor from which the first metal layer is adequately removed as explained above can be improved at that cleaned surface. Accordingly, the present invention may be applied to an optical semiconductor device which emits or receives lights.

In the thirteenth feature, a p-type semiconductor in the twelfth feature includes the uppermost layer of the Group III nitride compound semiconductor device and an electrode is formed on the uppermost p-type semiconductor layer.

Because the surface of the p-type semiconductor is cleaned in the present invention, an electrode which is strongly connective to the semiconductor and has excellent ohmic contact depending on conditions such as evaporation condition can be obtained thereon. That is, an optimum electrode can be formed according to each usage. For example, a semiconductor device which is optimum to mount on a vehicle can be fabricated.

In the fourteenth feature, the electrode formed on the surface of the p-type semiconductor has multiple layer structure. By forming the electrode to have multiple layer structure, a metal having good adhesiveness to the surface of the p-type semiconductor can be used to form the lower layer and a metal which can be easily wire-bonded can be used to form the upper layer formed thereon.

By varying metals for forming the lower and the upper layers, the electrode comprising those layers can have characteristics that the electrode is hardly oxidized, contact resistance between the electrode and the p-type semiconductor is reduced, and that the electrode is less deteriorated with time.

In the fifteenth feature, the electrode comprises at least one selected from the group consisting of cobalt (Co), nickel (Ni), aluminum (Al), copper (Cu), palladium (Pd), manganese (Mn), vanadium (V), gold (Au) and an alloy including at least one of these metals. As a result, adhesiveness between the electrode and the p-type semiconductor can be improved and contact resistance between them may be reduced. That is, driving voltage of the semiconductor device cam be reduced.

In the sixteenth feature, the electrode comprises an ally including at least two selected from the group consisting of cobalt (Co), nickel (Ni), aluminum (Al), copper (Cu), palladium (Pd), manganese (Mn), vanadium (V) and gold (Au).

By alloying the electrode, ohmic contactivity to the p-type semiconductor can be improved. When the alloy for forming the electrode is made of, for example, Ni/Au, a portion of Au atoms can be distributed into the surface layer of the p-type semiconductor. That is, contact resistance between the electrode and the p-type semiconductor can be decreased more. As a result, driving voltage can be decreased more.

In the seventeenth feature, the alloying process is carried out in an atmosphere comprising oxygen. For example, when the electrode is made of two or more metals each having different electronegativity, one of which contacts to the p-type semiconductor has higher electronegativity and is easier to be oxidized, the metal contacting to the p-type semiconductor react to the oxygen by carrying out heating treatment in an atmosphere comprising oxygen and then the metal is exposed to the surface through the other metal. At that time, impurities existing at the interface can also be removed with that oxidized metal. Accordingly, a metal layer having larger work function which is not contacted directly to the p-type semiconductor interface at the initial stage becomes to contact to the p-type semiconductor, to thereby provide more excellent contact.

By employing such methods, each condition such as kinds of metal and thickness of the metal layers which are comprised in the electrode can be independently adjusted (optimized). As a result, driving voltage of the device can be lowered more and the strongly connective electrode can be obtained.

The above-mentioned atmosphere comprising oxygen represents gas comprising at least one of the following molecules including oxygen atoms such as $O_2$, $O_3$, CO, $CO_2$, NO, $N_2O$, $NO_2$ and $H_2O$. Alternatively, the gas (atmosphere) may comprise other elements such as inert gases, e.g., group 0 element gases and nitrogen gases. So the gas may be an ambient room air.

DETAILED DESCRIPTION OF PREFERRED EMBODIMENTS

Figure 1A:
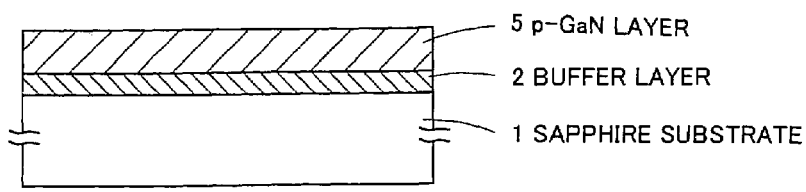
FIGS. 1A–1F are views showing steps of fabricating a p-type semiconductor according to a first embodiment of the present invention.
Figure 1B:
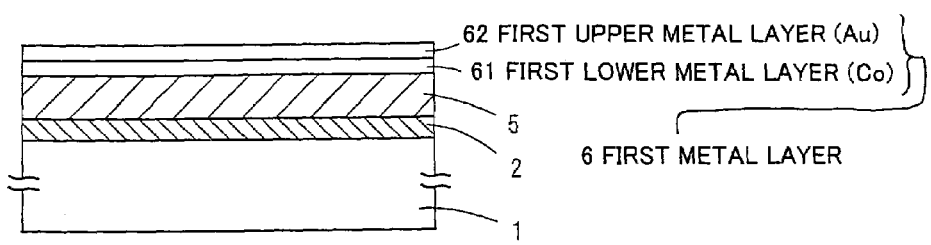
Figure 1C:
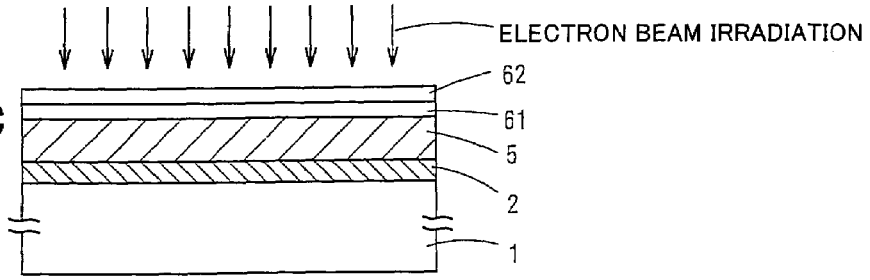

Embodiments of the present invention will next be described with reference to the drawings. The present invention is not limited to the below-described specific embodiments, and some part of the description of the present invention may be picked out arbitrary and regardless of other part of the description in order to comprehend the present invention.

In general, a p-type semiconductor in the present invention has arbitral compositions. Especially, a p-type semiconductor may be preferably a group III–V compound semiconductor, and further preferably a group III nitride compound semiconductor.

Alternatively, the group III nitride compound semiconductor can be made of quaternary compounds including AlGaInN, ternary compounds including AlGaN, GaInN, and AlInN, binary compounds including AlN, GaN, and InN. Here composition ratio of each element is arbitral. Also the group III nitride compound semiconductor can be made of compounds which is doped with group III elements, e.g., In, having a larger atomic radius than that of, e.g., Al and Ga, or doped with group V elements, e.g., P, As, and Sb having a larger atomic radius than that of, e.g., N,. Here, amount of dopants of group III or group V elements is so little that it is not reflected in a composition ratio of the semiconductor layer. Further alternatively, the group III nitride group compound semiconductor can be made of AlGaInN compounds, a part of whose composition N is substituted by, e.g., P, As, and Sb: AlGaInNP, AlGaInNAs, and AlGaInNSb. In short, the group III nitride compound semiconductor can be made of any of group III–V compound semiconductor including N.

A substrate used through crystal growth may comprise different materials such as sapphire, spinel ($MgAl_2O_4$), silicon (Si), carbon silicide (SiC), zinc oxide (ZnO), gallium phosphide (GaP), gallium arsenide (GaAs), magnesium oxide (MgO), manganese oxide (MnO), lithium gallium oxide ($LiGaO_2$), molybdenum sulfide (MoS), etc. Alternatively, a GaN substrate and other group III nitride compound semiconductor substrate may be employed.

With respect to the crystal growth, metal organic chemical vapor deposition (MOCVD, MOVPE), molecular beam epitaxy (MBE) and Halide vapor phase epitaxy (Halide VPE) can be used. In general, an objective crystal may preferably be grown after a buffer layer is formed on the substrate.

The buffer layer can be made of AlN, GaN, InN, $Al_xGa_{1-x}N$ (0<x<1), $In_xGa_{1-x}N$ (0<x<1), $Al_xIn_{1-x}N$ (0<x<1), and $Al_xGa_yIn_{1-x-y}N$ (0<x<1, 0<y<1, 0<x+y<1). The buffer layer can be also made of $Al_xGa_yIn_{1-x-y}N$ ($0 \leq x \leq 1$, $0 \leq y \leq 1$, $0 \leq x+y \leq 1$), in which group III elements may be partially substituted by boron (B) or thallium (Tl), and nitrogen atoms may be partially substituted by phosphorus (P), arsenic (As), antimony (Sb), or bismuth (Bi). Alternatively, the buffer layer may be doped with n-type dopants including Si or p-type dopants including Mg. Alternatively, the buffer layer may be formed to have a super lattice structure and comprise junctions of two or more types of semiconductors. Especially, when the substrate is made of Si, the buffer layer may preferably be made of SiC.

As a buffer layer, a low temperature growth buffer layer may be employed. Preferably, the buffer layer made of AlN may be formed at a temperature of 380° C. to 420° C. Preferably, the buffer layer made of GaN may be formed at a temperature of 500° C. to 700° C. Generally, the buffer layer may effectively function when it is formed at a temperature of 360° C. to 900° C., more preferably 360° C. to 600° C. Alternative to a low temperature growth buffer layer, a high temperature growth buffer layer may be applied. A high temperature growth buffer layer is, for example, grown at a temperature of 1000° C. to 1180° C. Preferably it is grown at a temperature of 1050° C. to 1170° C., and more preferably 1100° C. to 1150° C.

A buffer layer is formed by MOCVD. Alternatively, MBE can be applied to form a buffer layer. Further alternatively, sputtering can be applied. When the buffer layer is formed by different method, optimum temperature for growing the buffer layer may be different. A buffer layer made of AlN or GaN can be formed by a reactive sputtering in a DC magnetron sputtering equipment, using a high purity metal aluminum (Al) and $N_2$ gas as source materials. Alternatively, a buffer layer made of $Al_xGa_yIn_{1-x-y}N$ ($0 \leq x \leq 1$, $0 \leq y \leq 1$, $0 \leq x+y \leq 1$, where composition ratios x and y are arbitrary figures) using a metal aluminum (Al), a metal gallium (Ga), a metal indium (In), $N_2$ or $NH_3$ gas can be formed. As a method for forming the buffer layer, alternative to sputtering, evaporating, ion plating, laser abration, ECR, and plasma CVD can be used. These physical vapor deposit should be preferably carried out at a temperature of 200° C.

to 600° C., more preferably 300° C. to 500° C., and further more preferably 400° C. to 500° C.

When using these physical vapor deposition, the thickness of the buffer layer should be preferably in a range of 100 Å to 3000 Å. The thickness should be more preferably in a range of 100 Å to 2000 Å, and the most preferably 100Å to 300 Å. And it is preferable to carry out heat treatment after forming the buffer layer. Because a temperature of the substrate is raised while forming a layer on the buffer layer by crystal growth, a process of heating the substrate for the crystal growth may function as the heat treatment after forming the buffer layer. A heating temperature for the heat treatment should be preferably in a range of 1000° C. to 125020 C., more preferably 1050° C. to 1200° C., and the most preferably 1100° C. to 1150° C. As a result, a crystallization of the buffer layer becomes better because of recrystallization by the heat treatment in the temperature range shown above.

When an n-type Group III nitride compound semiconductor layer is to be formed, an element such as Si, Ge, Se, Te, and C, can be doped as an n-type impurity. And as a p-type impurity, an element such as Zn, Mg, Be, Ca, Sr, and Ba can be used.

Alternatively, the present invention may be applied to lower resistance of a p-type group III nitride compound semiconductor formed through lateral growth.

Hereinafter a method for lowering resistance of a semiconductor doped with p-type impurity is disclosed. Practically in order to lower resistance of a p-layer in a device, processes described below may be carried out after forming plural numbers of layer on the substrate. Ordinary, a p-layer whose resistance should be lowered tends to exist at a certain depth from the surface of a wafer laminated on the substrate. In a light-emitting diode, for example, an n-layer, a SQW or MQW layer, and a p-layer are generally formed on a substrate as fundamental layers. The present invention can be applied in order to lower resistance of the p-layer.

In order to show how much resistance is reduced, a p-type semiconductor is formed as follows.

(First Embodiment)

FIGS. 1A–1F illustrate a method for fabricating a low resistive p-type semiconductor. FIGS. 1A–1F are views showing processes for fabricating the low resistive p-type semiconductor. In the present embodiment, the p-type semiconductor was produced through metal-organic vapor phase epitaxy (hereinafter abbreviated as "MOVPE"). The following gasses were employed: $NH_3$, a carrier gas ($H_2$, $N_2$), trimethylgallium ($Ga(CH_3)_3$, hereinafter abbreviated as "TMG"), trimethylaluminum ($Al(CH_3)_3$, hereinafter abbreviated as "TMA"), and cyclopentadienylmagnesium (Mg $(C_5H_5)_2$, hereinafter abbreviated as "Cp$_2$Mg").

The method of the present invention may comprise 6 processes shown in FIGS. 1A–1F. First, a p-GaN layer 5 doped with p-type impurity was formed on a sapphire substrate 1 in process (a). The p-type impurity is Mg. The single crystalline sapphire substrate 1 was placed on a susceptor, which is not shown in FIG. 1A, in a reaction chamber for the MOVPE treatment after the principal surface of the substrate was cleaned by an organic washing solvent and heat treatment. Then, the sapphire substrate 1 was baked for about 30 minutes at 1100° C. under normal pressure in a state in which $H_2$ was fed to the reaction chamber at a flow rate of 2 liters/min.

Subsequently, while the substrate 1 was cooled to 400° C., $H_2$ was fed at 20 liters/min, $NH_3$ at 10 liters/min, and TMA at $2.0 \times 10^{-5}$ mol/min, resulting in formation of an AlN buffer layer 2 having a thickness of about 30 nm.

While the substrate 1 was maintained at 1100° C., $N_2$ or $H_2$ was fed at 20 liters/min, $NH_3$ at 10 liters/min, TMG at $1.0 \times 10^{-4}$ mol/min, and $CP_2Mg$ at $2 \times 10^{-5}$ mol/min, resulting in formation of an Mg-doped p-GaN layer 5 having a thickness of about 250 nm and an Mg concentration of $5 \times 10^{19}/cm^3$.

Then, process (b) is explained as follows. In process (b), a first lower metal layer 61 made of Co and a first upper metal layer 62 made of Au were formed in sequence on the p-GaN layer 5. The process (b) was carried out, for example, in a vacuum evaporation chamber. After evacuating the chamber to $10^{-3}$ Pa or less, about 7 Å in thickness of Co layer was formed on the p-GaN layer 5 and then about 30 Å in thickness of Au layer was formed thereon, to thereby form a first metal layer 6 comprising two layer structure made of Co/Au.

Figure 2:
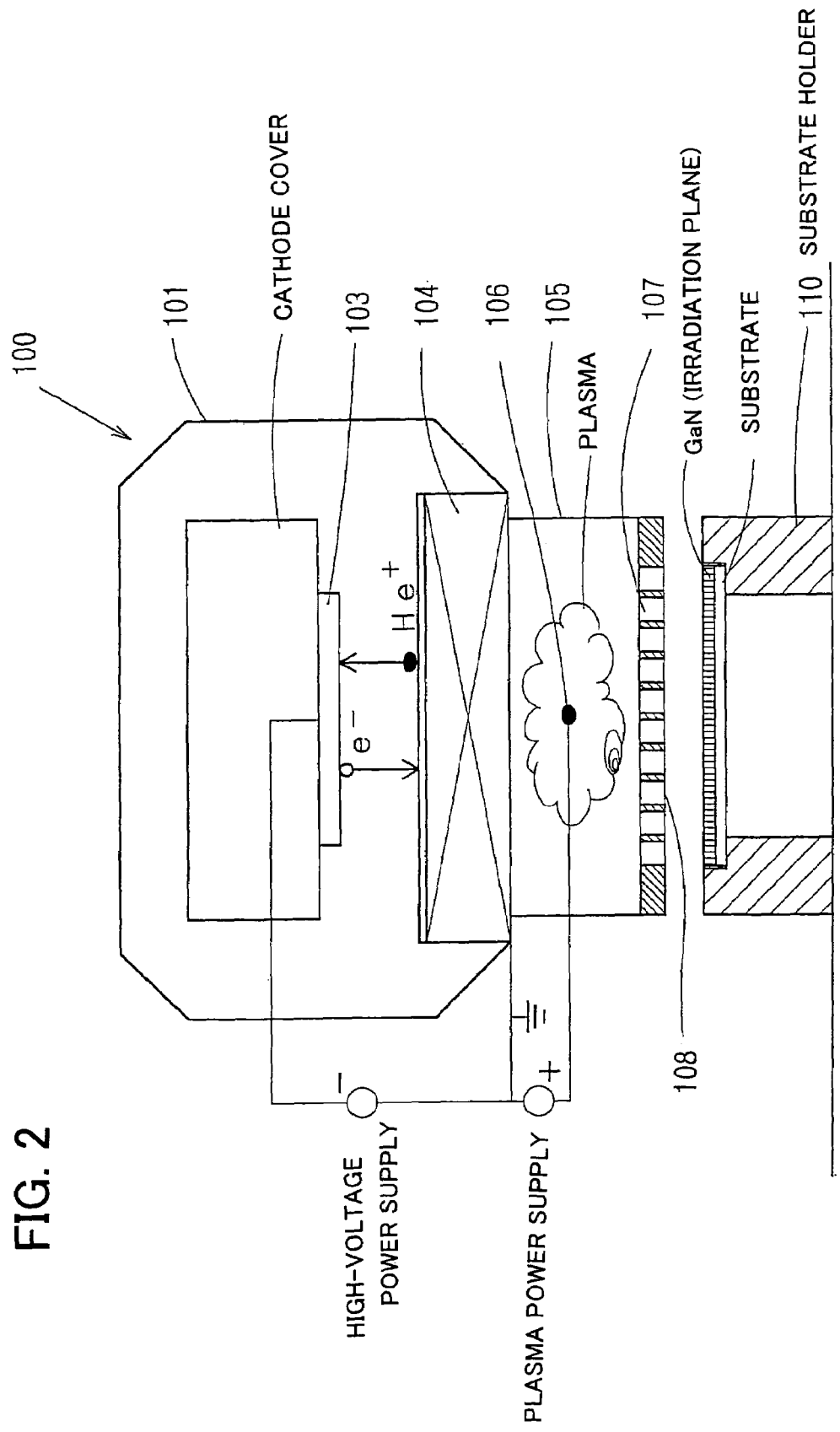
FIG. 2 is a cross-sectional view of an electron beam irradiation device 100 of the present invention.

Subsequently, process (c) is explained as follows. In process (c), electron beam irradiation was carried out in order to lower resistivity of the p-GaN layer 5. The electron beam irradiation process was carried out by using plasma. FIG. 2 shows an electron beam irradiation apparatus 100 using plasma. The electron beam irradiation apparatus 100 is equivalent to an apparatus disclosed in the Japanese patent application No. 2000-254306. The electron beam irradiation apparatus 100 mainly comprises: a vacuum chamber 101; a plasma chamber 105; and a substrate holder 110. In the vacuum chamber 101, a cathode (cold cathode) 103 and a grid 104 are arranged. And a wire 106 connecting to a plasma power supply and a window 107 for ejecting electron beams are arranged in the plasma chamber 105.

Practically, helium ion gas ($He^+$), generated in the plasma chamber 105 by using a plasma power supply and the wire 106, was accelerated in an electric field which was generated by using about, e.g., 200 kV of high-voltage power supply and then collided at high velocity to the surface of the cathode (cool cathode) 103 in the vacuum chamber 101. As a result, a great number of secondary electrons are emitted from the surface of the cathode 103 and they are accelerated owing to the electric field toward the direction reverse to that of helium ion gas. That enables the electron beam irradiation apparatus 100 to irradiate electron beams to wider area.

Figure 3:
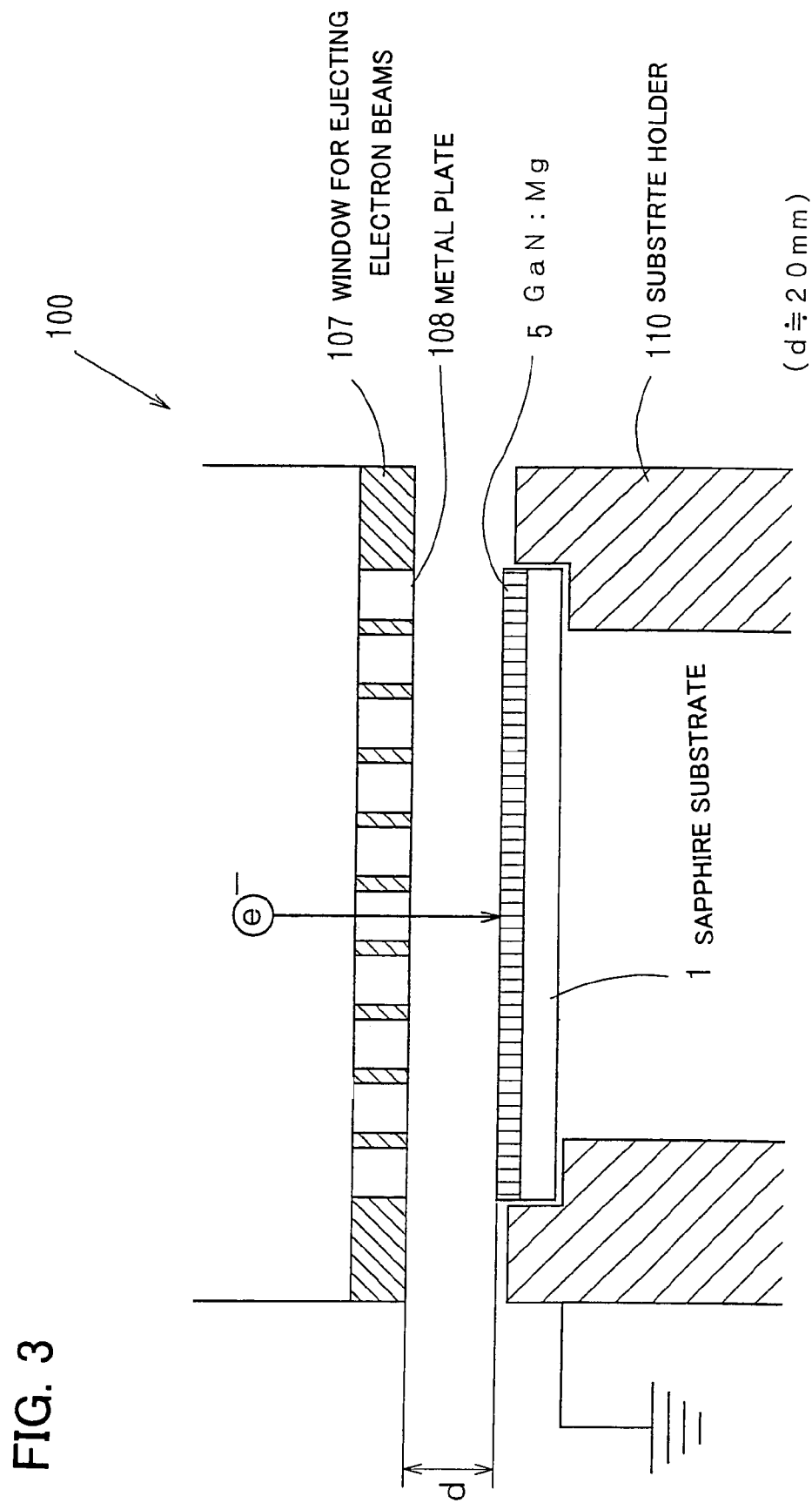
FIG. 3 is a cross-sectional view of a p-type semiconductor (GaN:Mg) in an electron beam irradiation process of the present invention.

Thus-generated electrons penetrate a thin metal plate 108 which forms the boundary surface of the window 107 for ejecting electron beams and shuts out ambient air and are irradiated to a semiconductor substrate, or a GaN layer, which is placed at the outside of the electron beam irradiation apparatus 100 (FIGS. 2 and 3). Generally, this process is carried out in an ambient air (process (c)).

Accordingly, by irradiating electron beams to the face of the p-GaN layer 5, resistivity of the p-GaN layer 5 can be lowered even in a time of about 3 minutes which is shorter than that in the conventional art. If the first metal layer 6 is not formed, the surface of the p-GaN layer 5 to the depth of several hundreds A may become a damaged layer. But the p-GaN layer 5 in the present invention is protected by the first metal layer 6, and that prevents from generating a damaged layer.

Next, process (d) was carried out as follows. In process (d), the first metal layer 6 was etched by using iodine based etching solution and the oxidized layer was exposed.

Next, process (e) was carried out as follows. In process (e), a second metal layer 10 was formed on the first metal layer 6 by using a vacuum evaporation equipment. The second metal layer 10 was made of, for example, nickel (Ni). The condition in the vacuum evaporation equipment was equivalent to that in the evaporation process (b). In short, after evacuating the vacuum evaporation chamber to be high vacuum of, for example, $10^{-3}$ Pa or less, 2000 Å in thickness of Ni layer was formed on the first metal layer 6. This process is carried out in order to remove the first metal layer 6 effectively and perfectly in the consequent etching process (f). Preferably, thickness of the Ni layer may be at least 1000 Å or more.

Thickness of the second metal layer 10 may preferably from 100 Å to 6000 Å. That is preferable for using the evaporation equipment. For example, in order to employ a evaporation process, the second metal layer 10 may be formed in an island pattern when its thickness is smaller than 100 Å. That prevents from removing the first metal layer uniformly in the consequent etching process. And when thickness of the second metal layer 10 is larger than 6000 Å, time for vacuum evaporation and etching inefficiently becomes longer, and that is not desirable.

Then, process (f) was carried out as follows. In process (f), the first metal layer 6 comprising an alloy layer 63 described above and a Ni layer, or the second metal layer 10, were removed by etching treatment. Fluoric nitric acid in which hydrofluoric acid:nitric acid:water were about 1:5:10 was employed as etching solution. As a result, almost all of the first metal layer 6 and the second metal layer 10 were completely removed in about 5 minutes. In short, the surface of the p-GaN layer 5 was cleaned.

When an electrode is formed on the p-GaN layer 5 which is obtained according to the process described above, contact resistance of the surface of the p-GaN layer 5 is reduced because the surface of the p-GaN layer 5 is cleaned. And the electrode can be formed by using elements which are optimum for minimizing its contact resistance. Also, resistivity of the p-GaN layer 5 is also lowered as described above. As a result, a semiconductor having decreased driving voltage can be obtained. Further, cleaning the surface of the p-GaN layer 5 enlarges luminous transmissivity of the layer. Accordingly, the present invention may be useful for forming an optical device. In short, the above-explained method for manufacturing a p-type semiconductor is quite useful for manufacturing an optical device which requires to decrease driving voltage and improve luminous intensity. The thus-obtained p-GaN layer 5 has about $5 \times 10^{18}/\text{cm}^3$ of high hole concentration, and it may be controlled to be $5 \times 10^{17}/\text{cm}^3$ to $5 \times 10^{18}/\text{cm}^3$ by controlling doping amount of Mg.

Doping magnesium (Mg) into GaN which is implanted with beryllium (Be) enables to control hole concentration to $5 \times 10^{19}/\text{cm}^3$. That can be applied to other Group III nitride compound semiconductor.

In the above low resistivity treatment, only a single layer, or a p-GaN layer 5, is formed on a substrate. That is useful for obtaining a p-GaN substrate. Alternatively, in order to form a p-layer in a device, first a plural number of layers are deposited and then low resistivity treatment is carried out to the uppermost layer and plural layers formed below the uppermost layer. As a p-type semiconductor layer, a semiconductor of an arbitrary compound can be used as explained above.

(Second Embodiment)

Figure 4:
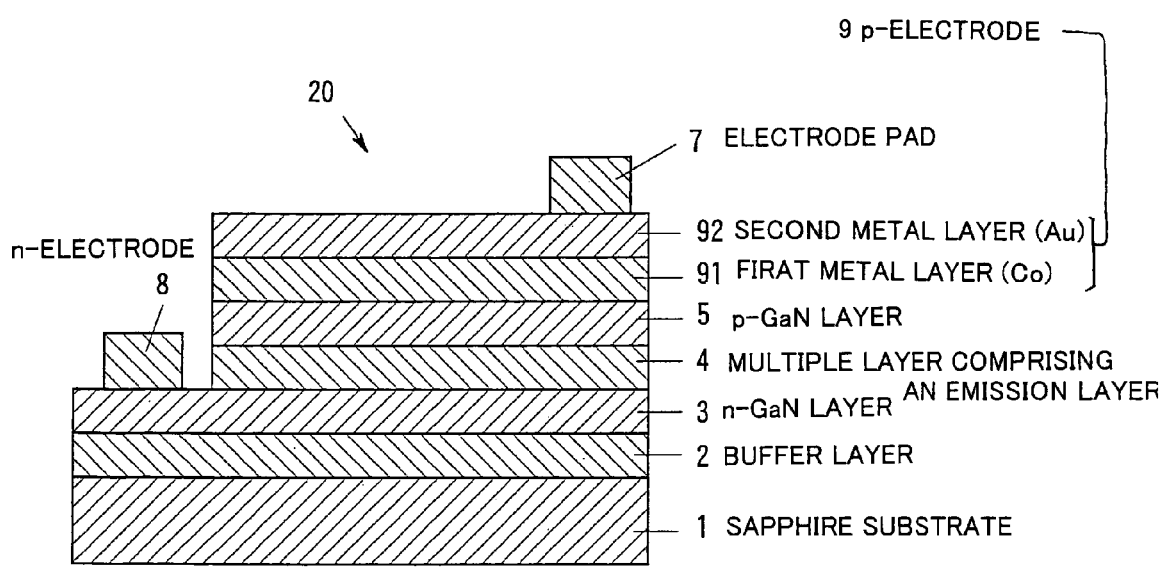
FIG. 4 is a cross-sectional view showing the structure of a light-emitting device according to a second embodiment of the present invention.

A light-emitting device 20 manufactured by using a method of the first embodiment is shown in FIG. 4. FIG. 4 is a sectional view illustrating structure of the light-emitting device 20. The light-emitting device 20 is a semiconductor device, or an $Al_xGa_yIn_{1-x-y}N$ ($0 \leq x \leq 1$, $0 \leq y \leq 1$, $0 \leq x+y \leq 1$) Group III nitride group compound semiconductor device.

In this embodiment, the light-emitting device 20 comprises a sapphire substrate 1, about 30 nm in thickness of AlN buffer layer 2 formed on the sapphire substrate 1, and about 4 μm in thickness of Si-doped n-GaN layer 3 is formed on the AlN buffer layer 2. A multiple layer 4 comprising an emission layer is formed on the n-GaN layer 3, and then about 300 nm in thickness of Mg-doped p-GaN layer 5 explained in the first embodiment is formed thereon.

On the p-GaN layer 5 which has lowered resistivity and cleaned surface by employing the method in the first embodiment, about 20 Å in thickness of first electrode layer 91 made of Co and about 60 Å in thickness of second electrode layer 92 made of Au are deposited in sequence by metal evaporation. The first electrode layer 91 and the second electrode layer 92 forms a transparent p-electrode 9. About 1.5 μm in thickness of electrode pad 7 comprising gold (Au) is formed on a certain portion of the p-electrode 9. On the n-type GaN layer 3, an n-electrode 8 comprising about 200 Å in thickness of vanadium (V) and about 2.0 μm in thickness of aluminum (Al) or aluminum (Al) alloy is formed. The electrode pad 7 may also comprise gold (Au), nickel (Ni), aluminum (Al), cobalt (Co), or an alloy including at least one of those metals.

Then, a method for manufacturing the light-emitting device 20 will be explained hereinbelow. The light-emitting device 20 was also produced through metal-organic vapor phase epitaxy (hereinafter abbreviated as "MOVPE"). The gases employed in the MOVPE treatment were same as those employed in the first embodiment. First, a single crystalline sapphire substrate 1 was placed on a susceptor, which is not shown in FIG. 4, in a reaction chamber for the MOVPE treatment after the principal surface of the substrate was cleaned by an organic washing solvent and heat treatment. Then, the sapphire substrate 1 was baked for about 30 minutes at 1100° C. under normal pressure in a state in which $H_2$ was fed to the reaction chamber at a flow rate of 2 liters/min. Subsequently, while the substrate 1 was cooled to 400° C., $H_2$ was fed at 20 liters/min, $NH_3$ at 10 liters/min, and TMA at $2.0 \times 10^{-5}$ mol/min, resulting in formation of an AlN buffer layer 2 having a thickness of about 30 nm.

Then while the substrate 1 was maintained at 1150° C., $N_2$ or $H_2$ was fed at 10 liters/min, $NH_3$ at 10 liters/min, TMG at $1.0 \times 10^{-4}$ mol/min, TMA at $0.5 \times 10^{-4}$ mol/min, and silane diluted with $H_2$ gas to 0.9 ppm at $5 \times 10^{-9}$ mol/min, resulting in formation of n-GaN layer 3 having a thickness of about 4 μm, electron concentration of $1 \times 10^{18}/\text{cm}^3$ and silicon concentration of $2 \times 10^{18}/\text{cm}^3$.

After forming the n-GaN layer 3, $N_2$ or $H_2$ was fed at 20 liters/min, $NH_3$ at 10 liters/min, TMG at $7.0 \times 10^{-5}$ mol/min, and TMI at $0.2 \times 10^{-4}$ mol/min, to thereby obtain a $Ga_{0.8}In_{0.2}N$ multiple layer 4.

Subsequently, while the substrate 1 was maintained at 1100° C., $N_2$ or $H_2$ was fed at 20 liters/min, $NH_3$ at 10 liters/min, TMG at $1.1 \times 10^{-4}$ mol/min, and $CP_2Mg$ at $2 \times 10^{-5}$ mol/min, resulting in formation of Mg-doped p-GaN layer 5 having a thickness of about 300 nm and Mg concentration of $5 \times 10^9/\text{cm}^3$.

Next, resistivity of the p-GaN layer 5 was decreased according to the processes described below.

(1) After evacuating a chamber in a vacuum evaporation equipment to $10^{-3}$ Pa or less, about 10 Å in thickness of Co layer was formed on the p-GaN layer 5, to thereby obtain a first lower metal layer 61.

(2) About 50 Å in thickness of Au was formed on the first lower metal layer 61, to thereby form a first upper metal layer 62.

(3) Then, resistivity of a semiconductor layer doped with p-type impurity was lowered by employing a method of the present embodiment. That is, electron beam irradiation is carried out by using the electron irradiation apparatus 100 (FIG. 2) in an ambient air over the metal layer (electrode). Here acceleration voltage of the high-voltage power supply (FIG. 2) is from 100 kV to 250 kV. That ensures to lower resistivity of the p-GaN layer 5.

Figure 1D:
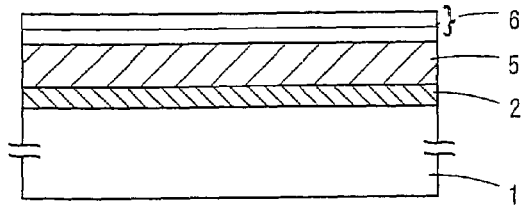
Figure 1E:
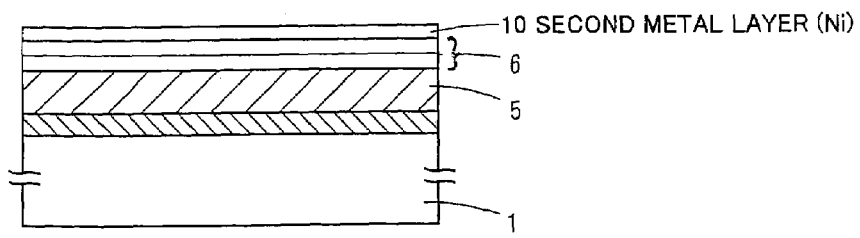
Figure 1F:
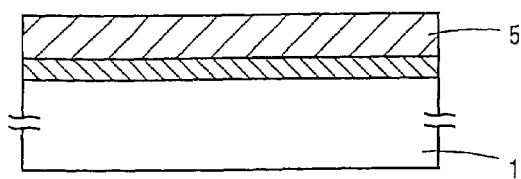

(4) Next, the surface of the p-GaN layer 5 was cleaned. That is to remove the first metal layer 6. In order to remove the first metal layer 6, processes (d) to (f) in the first embodiment were carried out (FIGS. 1D-1F). First, etching treatment using iodine based etching solution was carried out to remove impurities existing on the first metal layer 6, to thereby activate the surface of the first metal layer 6. Then about 1000 Å to 2000 Å in thickness of Ni layer, functioning as the second metal layer 10, was formed through vacuum evaporation (equivalent to the process (e)).

Next, etching treatment was carried out for a short time, e.g., about 3 minutes, by using fluoric nitric acid having the same composition ratios as those in the first embodiment. As a result, almost all the first metal layer 6 and the second metal layer 10 were completely removed. In short, the surface of the p-GaN layer 5 was cleaned.

Then process of forming an n-electrode and p-electrode will be described as follows.

(5) Next, a process for exposing the surface of the n-GaN layer 3 was carried out. An etching mask was formed on the p-GaN layer 5, a certain region of the mask was removed, and the region of the p-GaN layer 5 which is not covered by the mask, a portion of the multiple layer 4 and the n-GaN layer 3 were etched through reactive ion etching employing gases including chlorine. Then the surface of the n-GaN layer 3 was exposed.

(6) Next, an n-electrode 8 and a transparent p-electrode 9 are formed on the n-GaN layer 3 and the p-GaN layer 5, respectively.

(7) First, photoresist layer was applied to the n-GaN layer 3. A window was then formed on a predetermined region of the exposed surface of the n-GaN layer 3 by means of photolithography. After establishing a high vacuum of less than $10^{-3}$Pa vacuum order, about 200 Å of vanadium (V) and about 2.0 µm of aluminum (Al) were deposited on the window. The photoresist layer was then removed. And the n-electrode 8 was formed on the exposed surface of the n-GaN layer 3.

(8) A photoresist layer was then formed on the p-GaN layer 7. The portion of the photoresist layer above the electrode forming part of the p-GaN layer 5 was then removed by patterning using photolithography to form a window.

(9) After establishing a high vacuum of less than about $10^{-3}$Pa, about 20 Å of cobalt (Co) was formed on the photoresist layer and the exposed surface of the p-GaN layer 5 in the vacuum evaporation equipment. As a result, a first electrode layer 91 was obtained.

(10) Successively, about 60 Å in thickness of Au was formed on the first electrode layer 91, to thereby form a second electrode layer 92.

(11) The sample was then removed from the vacuum evaporation equipment and the cobalt (Co) and gold (Au) laminated on the photoresist layer were removed by a lift-off process leaving light-transmitting p-electrode 9 made of Co/Au.

(12) Next, an electrode pad 7 for bonding was formed on a portion of the light-transmitting p-electrode 9. First, a photoresist layer was uniformly formed to cover the p-electrode 9, and a window was formed on the predetermined region of the photoresist layer for forming the electrode pad 7. Then about 1.5 µm in thickness of metal including gold (Au) was deposited on the window by the vacuum evaporation, and the metal film including gold (Au) deposited on the photoresist layer was removed with it by a lift-off process as equivalent to the process (5), to thereby form the electrode pad 7.

(13) Finally, the light-transmitting p-electrode 9, the n-electrode 8 and the electrode pad 7 were combined to be an alloy. That enables to provide an excellent ohmic contact, to thereby lower driving voltage of the light-emitting device 20.

Consequently, the light-emitting device 20 was manufactured.

According to the processes described above, contact resistance of each electrode is decreased, and that enables to obtain a layer having lower driving voltage. And because the first metal layer 6 which is used for irradiating electron beams is completely removed, luminous transmissivity of the plane on which the first metal layer 6 is formed is improved. As a result, light transmitted from the multiple layer 4 comprising an emission layer can be effectively outputted from the light-transmitting p-electrode 9.

When the first metal layer 6 is not removed but used as a p-electrode, a light-emitting device comprising the p-electrode has driving voltage of 10.0V and luminous output of 210 µW.

When the p-electrode is formed after completely removing the first metal layer 6, a light-emitting device comprising the p-electrode has driving voltage of 3.5V and luminous output of 270 µW.

Accordingly, removing the first metal layer 6 enables to decrease driving voltage to be about ⅓ or less and to increase transmittance factor by 29% (difference from higher transmittance factor from lower transmittance factor/ lower transmittance factor) or more.

Figure 5:
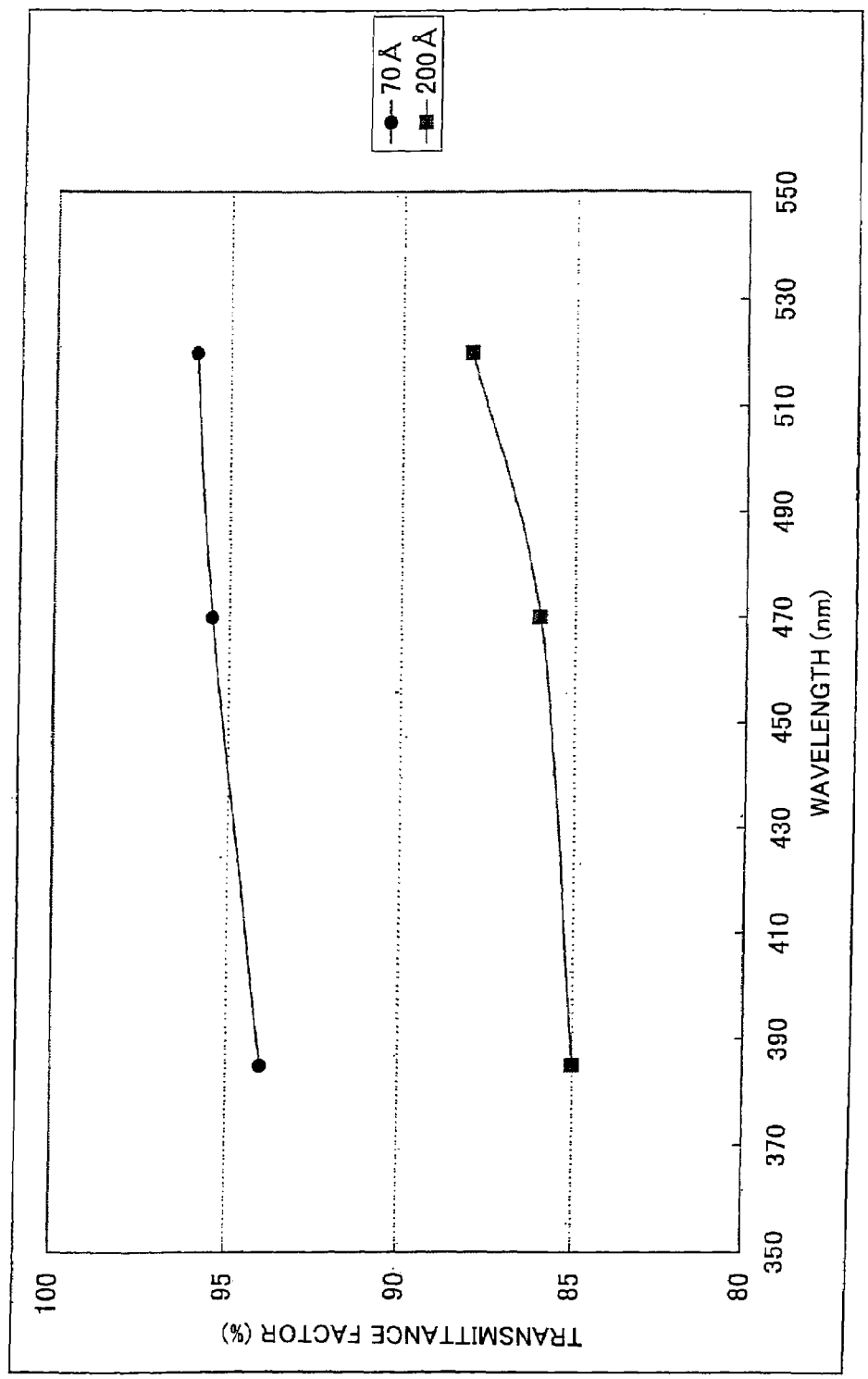
FIG. 5 is a graph showing the characteristic of the thickness of a first metal layer and optical transmittance factor of a p-type semiconductor after removing the first metal layer.

Next, the experimental result with respect to relationship between thickness of the first metal layer 6 and optical transmittance factor will be described in detail. By applying thickness of the first metal layer 6 to be 70 Å and 200 Å, respectively, electron beam was irradiated according to the method in the first embodiment and the second embodiment and a second metal layer 10 was deposited on the first metal layer 6. Then the first metal layer 6 was removed along with the second metal layer 10 and a semiconductor layer doped with p-type impurity was exposed. Optical transmittance factor of the semiconductor layer doped with p-type impurity was measured at wavelengths of 375 nm, 470 nm and 520 nm. FIG. 5 is a graph showing the data. Here transmittance factor shown by the vertical axis of the graph in FIG. 5 represents relative optical transmittance factor when optical transmittance factor of the semiconductor layer doped with p-type impurity before depositing the first metal layer 6 and the second metal layer thereon is 100% and which is normalized by the transmittance factor. When electron beam is irradiated to the first metal layer 6 having thickness of 70 Å, the relative optical transmittance factor of the semiconductor layer is 94% at wavelength of 375 nm, 95.5% at 470 nm, and 96% at 520 nm as shown in FIG. 5. When electron beam is irradiated to the first metal layer 6 having thickness of 200 Å, the relative optical transmittance factor of the semiconductor layer is 85% at wavelength of 375 nm, 86% at 470 nm, and 88% at 520 nm as shown in FIG. 5. Accordingly, in order to obtain the relative optical transmittance factor of 90% (at wavelength of 375 nm) to 92% (at wavelength of 520 nm) or more, thickness of the first metal layer 6 may preferably be 100 Å or less. In order to prevent from damaging the semiconductor layer doped with p-type impurity while electron beam irradiation process, thickness of the first metal layer 6 may preferably be 50 Å or more. Consequently, most preferable thickness of the first metal layer 6 is 50 Å to 100 Å.

In the above embodiment, the first metal layer 6 comprises two layers. Alternatively, the first metal layer 6 may comprise a single layer or three or more layers. Similarly, in the above embodiment, the second metal layer 10 is a single layer made of Ni. Alternatively, the second metal layer 10 may comprise multiple layers. The second metal layer 10 may be made of transition metal of group VIIIA. So, as well as Ni and Co, Fe, Ru, Rh, Pd, Os, Ir and Pt may be employed to form the second metal layer 10.

Consequently, the light-emitting device 20 was manufactured.

In the thus-obtained light-emitting device 20, lowering resistivity of the p-type GaN 5 can be carried out in extremely shorter time (about 3 minutes) more effectively compared with that in the conventional art.

In the light-emitting device 20, 150 kV of electron beam is irradiated to the p-type GaN layer 5, and holding time and luminous output after electric current reaches its optimum value (e.g., 11 mA) are measured. When the holding time is too long, luminous output tends to decrease. So the holding time may be preferably within 0 minute to 1 minute.

Alternatively, the light-emitting device may have a single quantum well structure or multiple quantum well structure.

In the above embodiment, Mg is used as an p-type impurity. Alternatively, Group II elements such as beryllium (Be), zinc (Zn), calcium (Ca), strontium (Sr), barium (Ba) and radium (Rh), and Group IV elements forming acceptor level such as carbon (C), silicon (Si), germanium (Ge), tin (Sn) and lead (Pb), may be applied.

The present invention may be applied not only to the conventional device in which a light-transmitting metal electrode is employed but also to a device in which a thicker electrode layer such as flip-chip type device is employed. Also, the present invention may be applied not only to a light-emitting device such as an LED and an LD but also to a light-receiving device.

In the embodiment, a device is shown as an example of lowering resistivity of the semiconductor layer doped with a p-type impurity. The present invention can also be applied to any semiconductor device using a semiconductor which is doped with a p-type impurity. In the above embodiment, a p-electrode is formed on the p-type semiconductor in order to lower contact resistance of the p-type semiconductor. The thus-obtained p-type semiconductor may have an excellent optical transmittance factor. Accordingly, the present invention can be applied to manufacture a light-emitting device or light-receiving device which outputs or inputs light from the surface of the p-type semiconductor. The light-emitting device may include a light-emitting diode and a light-emitting laser of a surface emitting type. In the present specification, a semiconductor device represents all the semiconductor devices which has an arbitral structure and comprises a p-type semiconductor and a p-type semiconductor layer manufactured by a method explained above, and all of such semiconductor devices may be included in the present invention.

In the above embodiment, the layer whose resistivity is lowered is represented by a p-GaN layer as an example. Alternatively, the layer whose resistivity is lowered may be made of an arbitrary element of group III nitride compound semiconductor doped with p-type impurity, such as AlGaN, InGaN and AlGaInN. Alternatively, AlGaInNAs and AlGaInNP comprising not only N but As and P may be employed as a Group V element.

While the present invention has been described with reference to the above embodiments as the most practical and optimum ones, the present invention is not limited thereto, but may be modified as appropriate without departing from the spirit of the invention.

What we claim is:

1. A method for fabricating a p-type semiconductor which lowers resistivity of a semiconductor doped with a p-type impurity, comprising:
   forming a first metal layer on the surface of said semiconductor which is doped with p-type impurity;
   irradiating electron beams to said semiconductor doped with p-type impurity through said first metal;
   forming a second metal layer on said first layer after electron beam irradiation process; and
   removing said first metal layer together with said second metal layer through etching treatment.

2. A method for fabricating a p-type semiconductor according to claim 1, wherein said second metal layer is formed after etching the surface of said first metal layer.

3. A method for fabricating a p-type semiconductor according to claim 2, wherein said first metal layer comprises at least one selected from the group consisting of cobalt (Co), nickel (Ni), aluminum (Al), copper (Cu), palladium (Pd), manganese (Mn), vanadium (V), gold (Au) and an alloy including at least one of these metals.

4. A method for fabricating a p-type semiconductor according to claim 1, wherein said first metal layer comprises at least one selected from the group consisting of cobalt (Co), nickel (Ni), aluminum (Al), copper (Cu), palladium (Pd), manganese (Mn), vanadium (V), gold (Au) and an alloy including at least one of these metals.

5. A method for fabricating a p-type semiconductor according to claim 4, wherein said second metal layer comprises at least one selected from the group consisting of nickel (Ni) and cobalt (Co).

6. A method for fabricating a p-type semiconductor according to claim 1, wherein said second metal layer comprises at least one selected from the group consisting of nickel (Ni) and cobalt (Co).

7. A method for fabricating a p-type semiconductor according to claim 1, wherein said etching treatment carried out after forming said second metal layer employs a mixture of hydrofluoric acid, nitric acid and water as an etching solution.

8. A method for fabricating a p-type semiconductor according to claim 1, wherein said semiconductor doped with p-type impurity comprises a Group III nitride compound semiconductor.

9. A method for fabricating a p-type semiconductor according to claim 1, wherein said p-type impurity comprises magnesium (Mg).

10. A method for fabricating a p-type semiconductor according to claim 1, wherein said first metal layer has a thickness of 5 Å to 10000 Å.

11. A method for fabricating a p-type semiconductor according to claim 1, wherein said first metal layer has a thickness of 5 Å to 100 Å.

12. A method for fabricating a p-type semiconductor according to claim 1, wherein said second metal layer has a thickness of 100 Å to 6000 Å.

13. A method for fabricating a p-type semiconductor according to claim 1, wherein an electrical potential of said first metal layer is maintained almost constantly by earthing.

* * * * *